United States Patent [19]
Choi et al.

[11] Patent Number: 5,625,594
[45] Date of Patent: Apr. 29, 1997

[54] DIGITAL VIDEO MEMORY

[75] Inventors: Go-Hee Choi, Seoul; Young-Ho Kim, Kyungki-do, both of Rep. of Korea

[73] Assignee: LG Semicon Co., Ltd., Cheongju, Rep. of Korea

[21] Appl. No.: 420,544

[22] Filed: Apr. 12, 1995

[30] Foreign Application Priority Data

Apr. 15, 1994 [KR] Rep. of Korea .................. 94-7882

[51] Int. Cl.[6] .................................................. G11C 7/00
[52] U.S. Cl. ................ 365/189.12; 365/78; 365/189.05; 365/220; 365/221
[58] Field of Search ......................... 365/239, 240, 365/221, 189.05, 189.12, 78, 220

[56] References Cited

U.S. PATENT DOCUMENTS

| | | | |
|---|---|---|---|
| 5,029,134 | 7/1991 | Watanabe | 365/189.12 X |
| 5,265,051 | 11/1993 | Jeong | 365/189.12 X |
| 5,374,851 | 12/1994 | Iwase et al. | 365/189.12 X |
| 5,381,378 | 1/1995 | Okimura | 365/189.12 X |
| 5,463,591 | 10/1995 | Aimoto et al. | 365/189.12 X |

*Primary Examiner*—Do Hyun Yoo
*Attorney, Agent, or Firm*—Alan R. Loudermilk

[57] ABSTRACT

A digital video memory circuit. The circuit includes a DRAM for storing thereto and reading data therefrom, a register group having registers for holding data to be written to and read from the DRAM, a selector having switching transistors connecting registers in the register group to an I/O data bus, respectively, for storing data on the I/O data bus to the DRAM and for transferring data from the DRAM to the I/O data bus. The register group includes a first register set and a second register set connected serially between the DRAM and the selector, the second register set transferring data on the I/O data bus to the first register set, and the first register set transferring data from the second register set to the DRAM. The second register set can receive data on the I/O data bus while the first register set writes previously received data to the DRAM.

8 Claims, 5 Drawing Sheets

DIGITAL VIDEO MEMORY

FIELD OF THE INVENTION

The present invention relates to digital memories, and more particularly to a digital video memory in which data can be accessed successively with less time delay.

BACKGROUND OF THE INVENTION

In a video apparatus such as a video camera, a television, a video tape recorder, etc., an analog signal obtained by scanning an image in a Braun tube or a video capturing device such as, for example, a charge coupled device (or "CCD"), is digitized and stored in some type of storing means. One type of storing means is a digital video memory, which is used for retrieving image data by reading the video signal stored therein and for reconstructing the image on a display screen.

Such a digital video memory is illustrated in FIG. 1, and the operation timing for such a digital video memory is illustrated in FIG. 3. A register circuit used in this type of digital video memory is illustrated in FIG. 2. The register circuit will be explained first referring to FIG. 2.

In the register circuit illustrated in FIG. 2, the source of PMOS transistor MP1 is connected to receive enable signal SRG, and the drain of transistor MP1 is connected to bit line (data line) /RBL, and the gate of transistor MP1 is connected to bit line (data line) RBL. The source of transistor MP2 is connected to receive enable signal SRG, the drain of transistor MP2 is connected to bit line RBL, and the gate of transistor MP2 is connected to bit line/RBL. The source of NMOS transistor MN2 is connected to Vss, the drain of transistor MN2 is connected to bit line RBL, and the gate of transistor MN2 is connected to bit line RBL. The source of transistor NMOS transistor MN1 is connected to Vss, the drain of transistor MN1 is connected to bit line /RBL, and the gate of transistor MN1 is connected to bit line RBL.

Transistors MP1 and MN1 constitute a first inverter, and transistors MP2 and MN2 constitute a second inverter. The first and second inverters operate as a latch.

If a "1" (high level voltage) is applied to bit line RBL, a "0" (low level voltage) is applied to bit line /RBL, and a high level voltage is applied as enable signal SRG, then transistors MN1 and MP2 turn on, and transistors MN2 and MP1 turn off. As a result, this "register" latches the values of bit lines RBL and /RBL.

FIG. 1 is a block diagram of a conventional digital video memory, which consists of dynamic random access memory ("DRAM") 1, register 2 and selector 3.

DRAM 1 includes a plurality of sense amplifiers 4, 5, 6, 7 (SA1, SA2, SA3, . . . SAn), a plurality of bit lines BL and /BL, and a plurality of word lines WL.

Register 2 includes a number of registers 8, 9, 10, 11 (RG1, RG2, RG3, . . . RGn) which are connected to transfer gates (switches) 12, 13, 14, 15, 16, 17, 18 and 19. These transfer switches (MOSFET transistors) are connected to bit lines /BL and BL of the sense amplifiers, respectively, and the gates of the switches are connected to receive transfer signal XF.

Selector 3 has switching transistors 20, 21, 22, 23, 24, 25, . . . 26 and 27, which are NMOS transistors. Bit lines BL and /BL, which are connected to sense amplifiers in DRAM 1, also are connected to sources of transfer switches in register 2. Gates of the transfer switch MOSFETs are connected to receive signal XF and drains of the transfer switch MOSFETs are connected to each register, respectively. Each register performs a latching function, with the enable signal line of each register connected to receive enable signal SRG. The inputs of each of the registers is connected to a drain of a respective transfer switch, and the output of each register is connected to a source of a respective switching transistor of selector 3.

Each pair of gates of the switching transistors connected to each of bit lines RBL and /RBL of selector 3 are connected to receive a corresponding select signal S1–Sn, and the drain of each transistor of the switching transistor pairs is connected to an I/O line, and the other drain of each transistor of the switching transistor pairs is connected to the other I/O line. Bit lines RBL and/RBL are outputs of each register of register 2.

Operation of such a conventional circuit will be explained with reference to the timing chart illustrated in FIG. 3. In read mode, firstly a WL of the DRAM is selected by a row address. Data stored in designated DRAM cells, which are connected to the selected WL, are amplified by the sense amplifiers. As a result, bit lines BL and /BL connected to each of the sense amplifiers are established as "0" or "1" according to the data stored in the DRAM cells.

FIG. 3 illustrates a case in which bit line BL becomes a "1". After signal SRG goes to a "hi-Z" state (or high impedance state) for a short time, each of the signals of bit lines BL and /BL are transferred to the corresponding registers in response to signal XF being a "1." Signal SRG becomes Vcc level, and the input signal of each of bit lines BL and /BL are latched in the respective register. Thereafter, column address signals S1–Sn sequentially select the registers in response to system clock /SC, and thus the data stored in the DRAM are output serially from the registers in accordance with the system clock to data bus I/O.

Before all data in register 2 are output, a new WL in DRAM 1 is selected, and data sensed by the sense amplifiers are established on bit lines BL and /BL. After all data are read out of register 2 through data bus I/O, signal SRG goes hi-Z again, and signal XF becomes "1." Thereafter, signal SRG becomes Vcc level, the input signals of each of bit lines BL and /BL are latched again in the respective register, and column address signals S1–Sn sequentially select the registers, and thus the data stored in the DRAM are output serially from the registers in accordance with the system clock to data bus I/O. In such a way, data stored in the DRAM can be transmitted serially from the register to data bus I/O.

In write mode, signals S1–Sn are enabled sequentially according to the system clock in response to the column address of the DRAM, and serial data appearing on data bus I/O are written in each register, respectively, while the register enable signal SRG holds a "1" state. When data are latched in the register, a WL is selected by a row address of the DRAM, and the data from the register are transferred to cells of the DRAM by transfer signal XF going to a "1" state. After this operation, signal XF goes to a "0" state, and new data are written in the register from the data bus I/O.

As described above, in the conventional digital video memory, while the word line WL is assigned for writing data to DRAM cells, and data are being transferred from the register in order to write data, the register cannot receive new data from data bus I/O.

Digital video memories need to synchronize the data transfer cycle with the system clock and write consecutively in order to receive and store consecutive data. But conventional techniques do not satisfy this need at a speed fast enough to receive consecutive serial data from data bus I/O in a desired manner.

SUMMARY OF THE INVENTION

An object of the present invention is to provide an improved digital video memory that may receive consecutive data on an I/O data bus while previously received data are written to DRAM cells.

A digital video memory according to present invention can receive serial data consecutively appearing on an I/O data bus and save the received data in registers temporarily, and write the received data in cells of a DRAM. To perform such functions, the digital video memory of the present invention includes two register sets, one of which receives data from an I/O data bus, while the other one of which writes data to the DRAM.

A digital video memory circuit according to the present invention includes a DRAM for storing and reading data, a register group having registers for holding data to be written to and read from the DRAM, a selector having switching transistors connecting registers in the register group to the I/O data bus, respectively, the circuit storing data on the I/O data bus to the DRAM and transferring data from the DRAM to the I/O data bus. The register group may comprise a first register set and a second register set, which are connected serially between the DRAM and the selector, the second register set transferring data on the I/O data bus to the first register set, and the first register set transferring data from the second register set to the DRAM. The second register set can receive data on the I/O data bus while the first register set writes previously received data to the DRAM.

The DRAM may have the same structure as a conventional DRAM and also may have the same functionality as a conventional DRAM. For example, the DRAM may have a plurality of sense amplifiers, a plurality of bit lines BL and /BL, and a plurality of word lines WL, etc.

A digital video memory circuit according to another aspect of the present invention includes a DRAM for storing data thereto and reading data therefrom, a register group for holding data to be written to and read from the DRAM, a selector having switching transistors connecting registers in the register group to the I/O data bus, the circuit storing data on the I/O data bus to the DRAM and transferring data from the DRAM to the I/O data bus, wherein the register group comprises an upper register set and a lower register set, which are connected in parallel between the DRAM and the selector, wherein the upper register set may transfer data latched therein to the DRAM while the lower register set may receive data from the I/O data bus, and the upper register set may transfer data latched therein to the I/O data bus while the lower register set may receive data from the DRAM.

A further object of the present invention is to provide a method for writing data from an I/O data bus to a DRAM and reading data from the DRAM to the I/O data bus using a digital video memory circuit, the circuit having a DRAM for storing and reading data, a register group for holding data to be written to and read from the DRAM, a selector having switching transistors connecting registers in the register group to the I/O data bus, wherein the register group comprises a first register set and a second register set, which are connected serially between the DRAM and the selector, the second register set transferring data on the I/O data bus to the first register set, and the first register set transferring data from the second register set to the DRAM, the method comprising the steps of writing data latched in the first register set to the DRAM while concurrently receiving data from the I/O data bus and latching the received data in the second register set transferring data latched in the second register set to the first register set, and repeating the above steps.

Another method of the present invention for writing data from an I/O data bus to a DRAM and reading data from the DRAM to the I/O data bus using a digital video memory circuit including DRAM for storing and reading data, a register group for holding data to be written to and read from the DRAM, a selector having switching transistors connecting registers in the register group to the I/O data bus, respectively, for storing data on the I/O data bus to the DRAM and for transferring data from the DRAM to the I/O data bus, wherein the register set comprises an upper register set and a lower register set, which are connected in parallel between the DRAM and the selector, the method comprising the steps of writing data latched in the upper register set to the DRAM while concurrently receiving data from the I/O data bus and latching the received data in the lower register set, writing data latched in the lower register set to the DRAM, while concurrently receiving data from the I/O data bus and latching the received data in the upper register set, and repeating the above steps.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

The present invention, which is an improvement over conventional digital video memories, may write without a time delay when writing data to the DRAM consecutively in a write mode.

Figure 1:
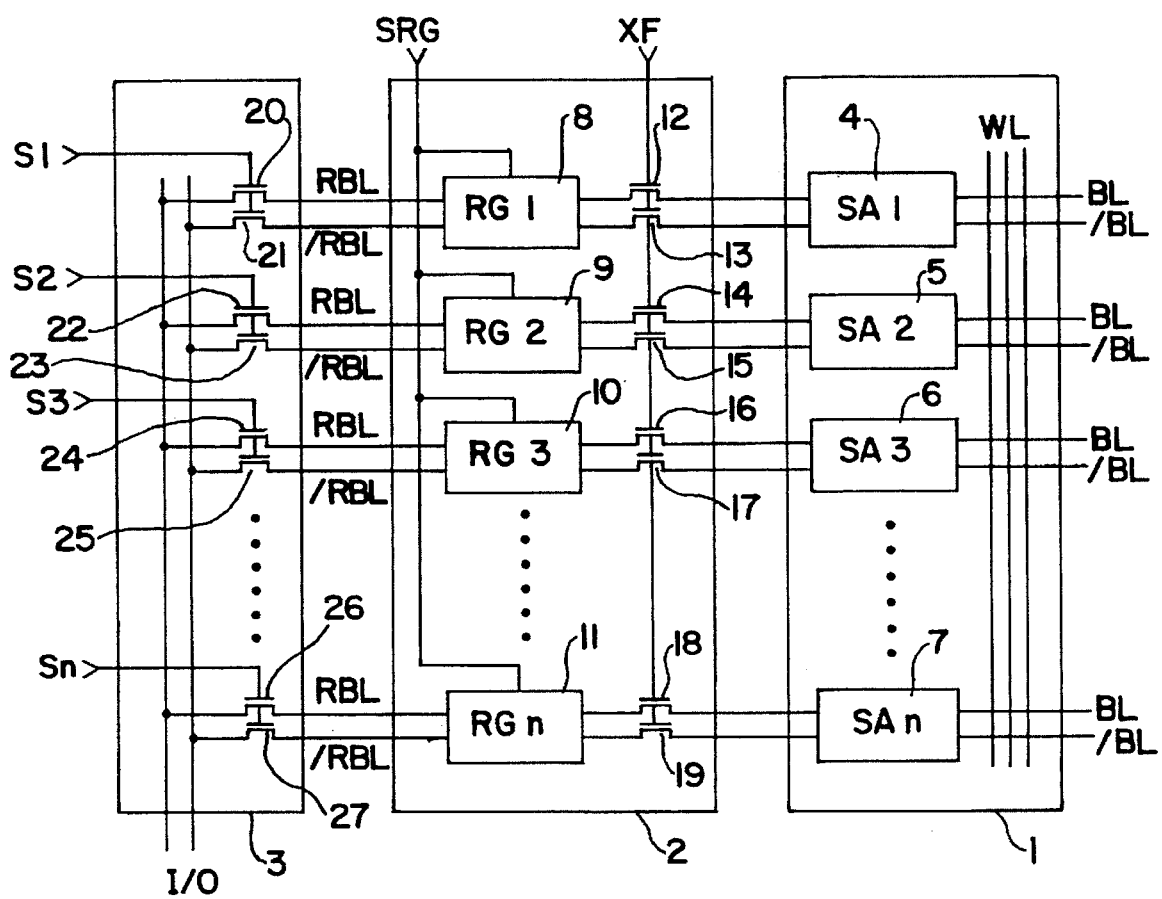
FIG. 1 is a circuit diagram illustrating a conventional digital video memory.
Figure 2:
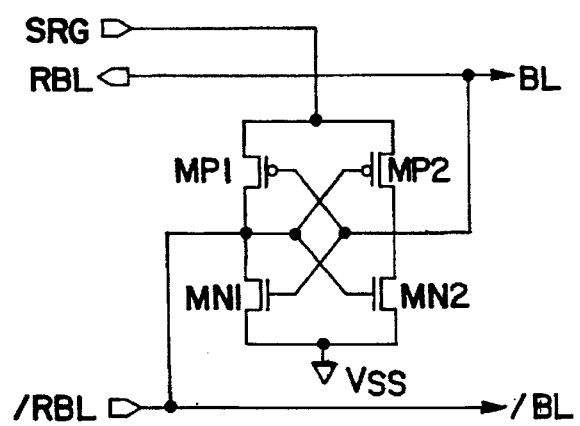
FIG. 2 is a circuit diagram illustrating a register circuit used in digital video memories.
Figure 3:
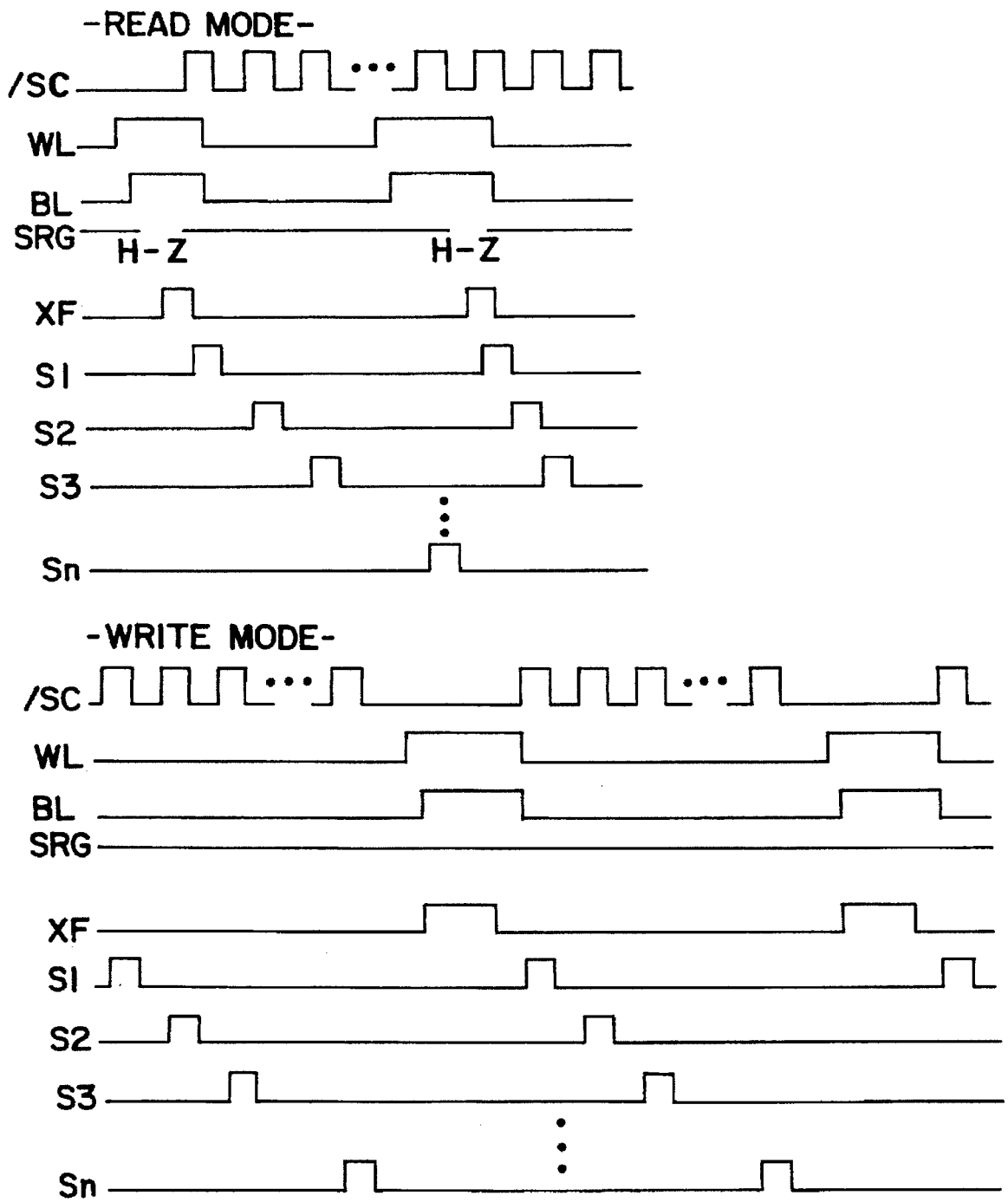
FIG. 3 is a timing chart illustrating the operation of the conventional circuit illustrated in FIG. 1.
Figure 4:
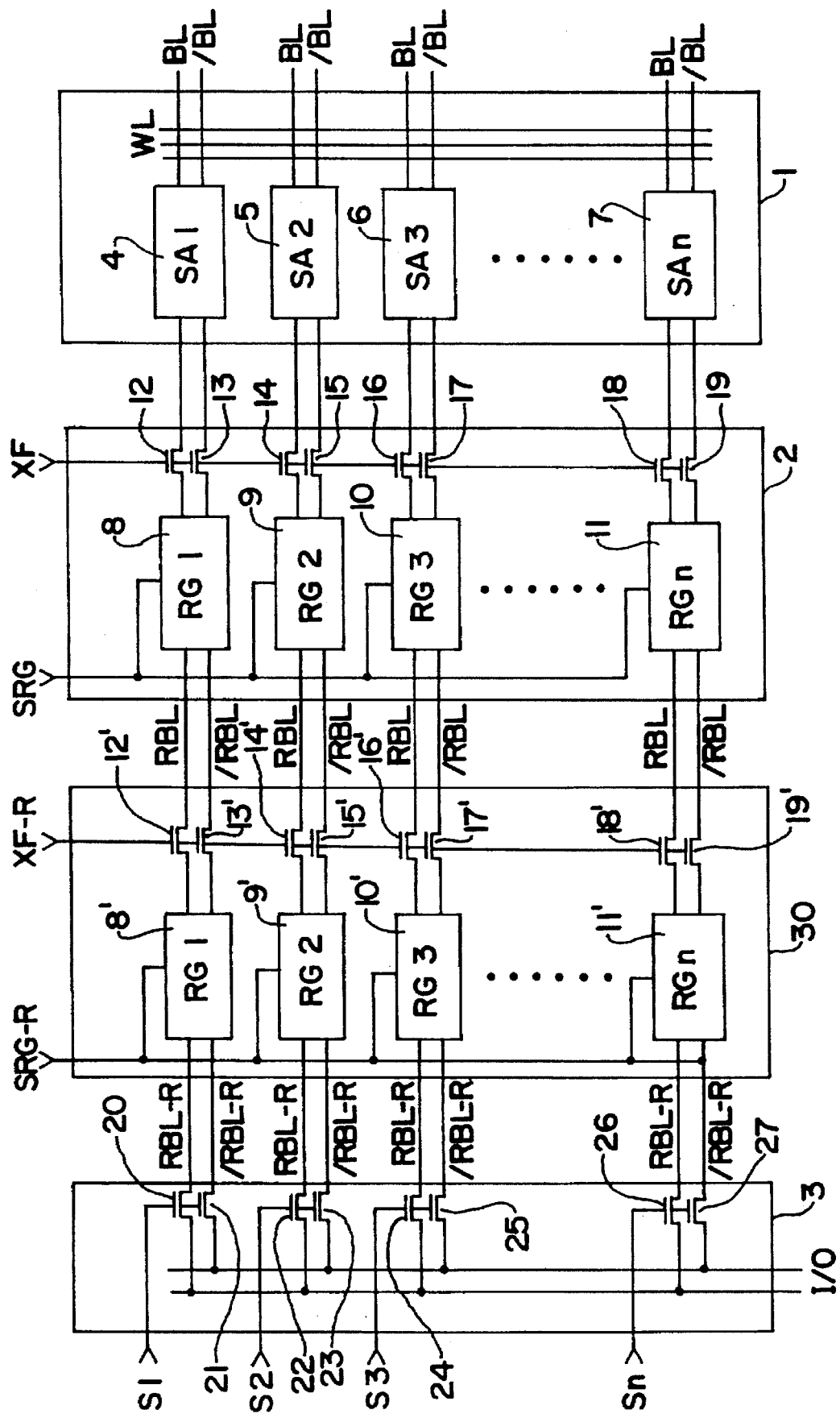
FIG. 4 is a circuit diagram illustrating a digital video memory according to one embodiment of the present invention.

FIG. 4 is a block diagram illustrating a digital video memory circuit according to one embodiment of the present invention, and the same reference numbers are used for the elements that may have the same function and operation as the circuit of FIG. 1.

A digital video memory circuit of the present invention includes DRAM 1, first register set 2, second register set 30, and selector 3. As illustrated in FIG. 4, second register set 30 is inserted between register set 2 and selector 3, as compared with the digital video memory illustrated in FIG. 1.

DRAM 1 includes a plurality of sense amplifiers SA1 4, SA2 5, SA3 6, SAn 7, bit lines BL and /BL, and word lines WL. First register set 2 includes a plurality of first registers RG1 8, RG2 9, RG3 10, RGn 11, which are connected to first transfer switches. The first transfer switches are MOS transistors 12, 13, 14, 15, 16, 17, 18 and 19, which are connected with bit lines /BL and BL of the sense amplifiers of DRAM 1, respectively, and the gates of these transistors are connected to receive first transfer signal XF. Data (bit) lines RBL and /RBL are data lines of first register set 2. An enable signal of first register set 2 is connected to receive first enable signal SRG.

Second register set 30 is similar to first register set 2, and includes a plurality of registers RG1 8', RG2 9', RG3 10', ... RGn 11', which are connected to data lines RBL and /RBL through a plurality of second transfer switches. The second transfer switches are second MOS transistor 12', 13', 14', 15', 16', 17', 18' and 19'. Date lines RBL-R and/RBL-R are data lines of second register set 30. All gates of the second MOS transistors are connected to receive second transfer signal XF-R. An enable signal of second register set 30 is connected to receive second enable signal SRG-R.

Selector 3 includes switching transistor 20, 21, 22, 23, 24, 25, 26 and 27, which are MOS transistors.

Bit lines BL and /BL, which are outputs of the sense amplifiers in DRAM 1, are connected to sources of the first transfer switches in first register set 2. Gates of the first transfer switches are connected to receive signal XF and drains of the first transfer switches are connected to respective registers of first register set 2. Each register of first register set 2 may have a structure as illustrated in FIG. 1, with a function of latching, and is connected to be enabled by first enable signal SRG. The inputs of the registers of first register set 2 are connected to drains of the first transfer switches, respectively, and outputs of the registers of first register set 2 are connected to sources of the second transfer switches, respectively, in second register set 30.

Gates of the second transfer switches are connected to receive signal XF-R, and drains of the second transfer switches are connected to respective registers of second registers set 30. Each register of second register set 30 is connected to be enabled by second enable signal SRG-R, with inputs connected to drains of the second transfer switches and outputs connected to respective switching transistors in selector 3. Gates of the switching transistors are connected to select signals S1–Sn, for sequential selection, and drains of the switching transistors are connected to data lines RBL-R or /RBL-R, which are outputs of second register set 30.

Selector 3 consists of MOS transistors, which connect the outputs of second register set 30 to data lines I/O. Each gate of the transistors of selector 3 is connected to receive a respective signal S1, S2, S3, Sn.

Figure 5:
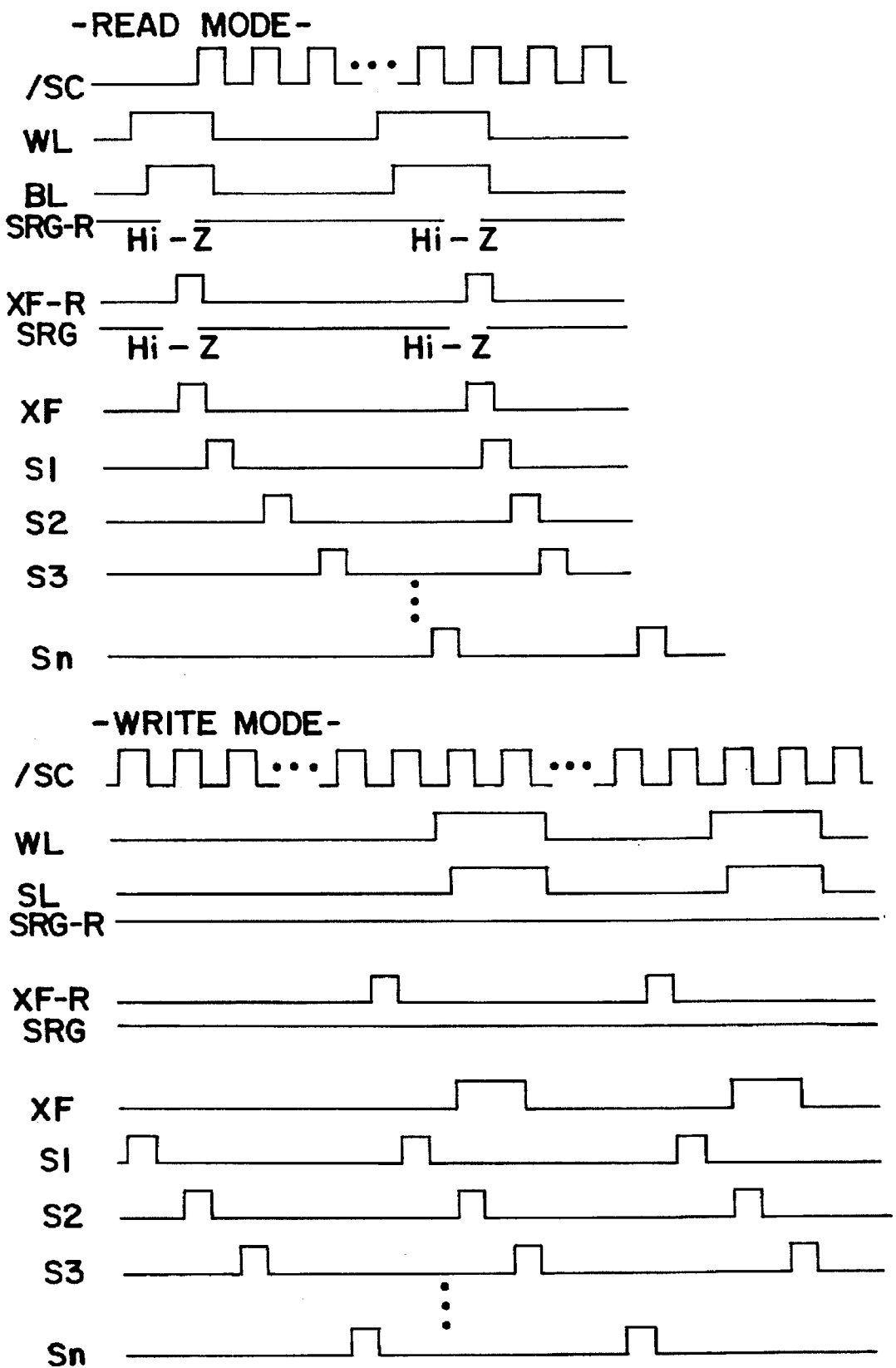
FIG. 5 is a timing chart illustrating operation of the embodiment illustrated in FIG. 4.

Operation of a digital video memory in accordance with the present invention will be explained with reference to the timing chart of FIG. 5.

In read mode, a WL is selected by a row address of DRAM 1 and data of the cells of DRAM 1, which are connected to a selected wordline WL, are amplified by the sense amplifiers. As a result, bit lines BL and /BL are established as "0" or "1". FIG. 5 illustrates an example where bit line BL is a "1". After first enable signal SRG of first register set 2 and second enable signal SRG-R of second register set 30 go momentarily to a hi-Z state, both first transfer signal XF of first register set 2 and second transfer signal XF-R of second register set 30 become "1" (high level voltage) at the same time. Just after this point in time, a Vcc level voltage is applied as signals SRG and SRG-R in order to activate the MOS transistors in the registers. Thus, data of bit lines BL and/BL are transferred to data lines RBL and /RBL and to data lines RBL-R and /RBL-R, and are thereby latched in the respective registers. While signal SRG-R is maintained as a "1", the data are maintained on data lines RBL-R and /RBL-R.

Afterwards, DRAM and first register set 2 are decoupled from each other by signal XF becoming a "0".

Next, data of selected registers are transferred to data bus I/O serially by selecting respective signals S1–Sn. The data transfer from DRAM 1 to the registers almost has no time delay and may be transferred rapidly. The next read operation may occur in a similar manner as discussed above, or, alternatively, while data in second register set 30 are read to data bus I/O, first register set 2 may be receiving and latching data from DRAM 1. After the data in second register set 30 are read, data in first register set 2 may be transferred in a timely manner to second register set 30 almost immediately. Such an operation can be readily accomplished by proper selection of enable signals SRG and SRG-R and transfer signals XF and XF-R.

In write mode processing, which writes data through data bus I/O to DRAM 1, signals S1–Sn are selected for turning on the respective switching transistors synchronously with the system clock by using column address of DRAM 1, and serial data of data bus I/O are written in each register of second register set 30. At the same time, both enable signals SRG-R and SRG of the first and second register part become a "1", and transfer signal XF-R of second register set 30 is a "0". When all data are written to the second registers of second register 30, signal SRG of first register set 2 goes to a hi-Z state, signal XF goes to a "0", and signal XF-R goes to a "1". Thereby data in the registers of second register set 30 are transferred to first register set 2. After the registers in first register set 2 hold the value in response to signal SRG going to a "1", the first and second register sets are decoupled by signal XF-R going to a "0". Thereby, data in second register set 30 can be transferred to first register set 2.

At a subsequent time, the registers in second register set 30 may receive new data, consecutively. Before all registers in second register set 30 have been latched with new data, the data latched in the registers in first register set 2 may be transferred to DRAM i by signal XF becoming a "1" after selecting a word line of DRAM 1 to be written. In this case, signal XF holds a "1" in order to write data to cells of DRAM 1 until bit lines BL and /BL change according to the data state of data lines RBL and /RBL in first register set 2.

Figure 6:
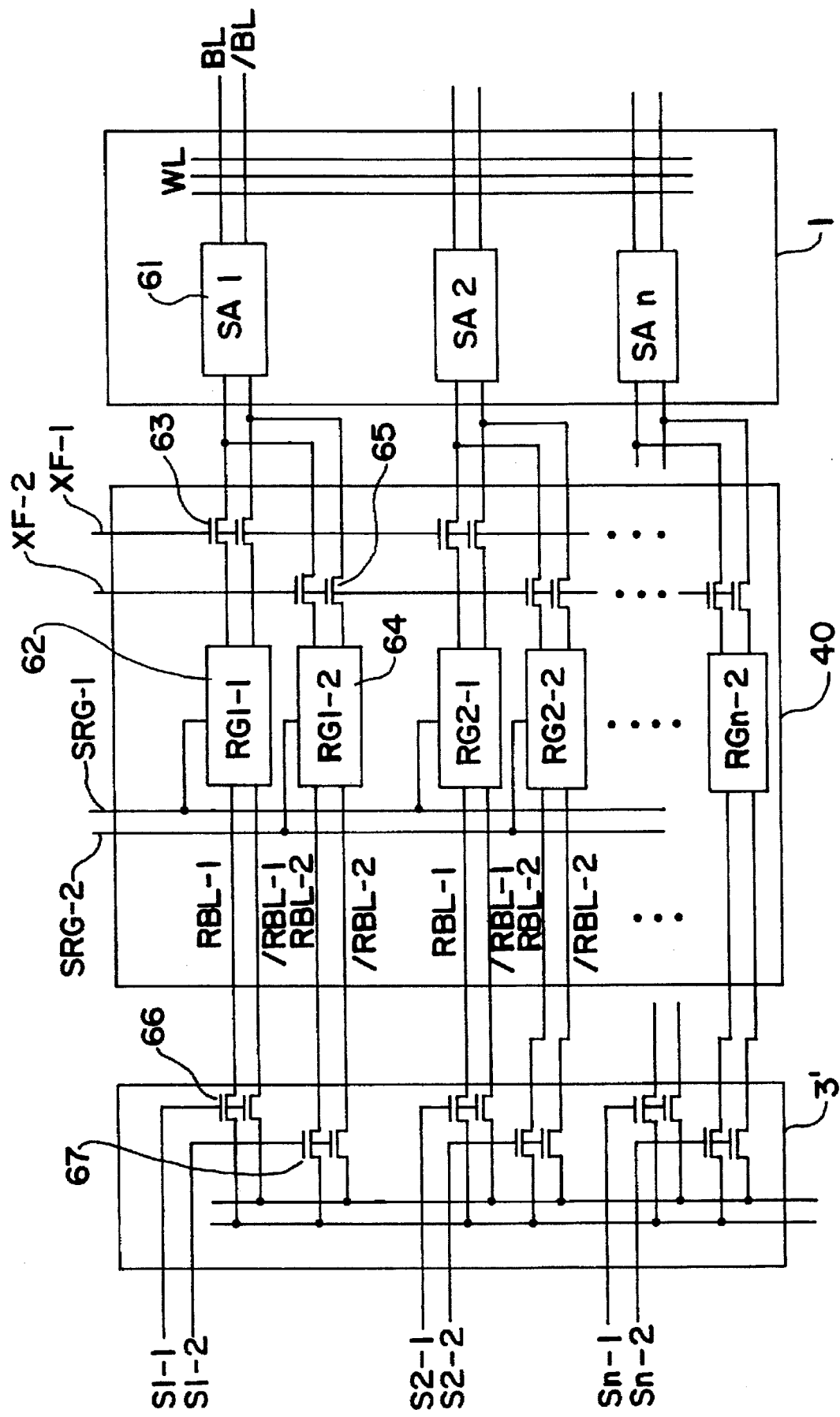
FIG. 6 is a circuit diagram illustrating a digital video memory according to a second embodiment of the present invention.

FIG. 6 illustrates a second embodiment of the present invention. In this second embodiment, a digital video memory circuit for storing data on data bus I/O to DRAM 1 and for transferring data from DRAM 1 to data bus I/O, includes DRAM 1 for storing data thereto and reading data therefrom, register group 40 for holding data to be written to and read from DRAM 1, selector 3' having switching transistors connecting registers in register group 40 to data bus I/O, respectively.

Register group 40 includes an upper register set and a lower register set, which are connected parallely with each other between DRAM 1 and selector 3'. Thus, the upper register set may transfer data latched therein to DRAM 1, while the lower register set receives data from data bus I/O, and the upper register set may transfer data latched therein to data bus I/O, while the lower register set may receive data from DRAM 1.

DRAM 1 may be constituted in the same way as with the first embodiment. DRAM 1 may have a number of sense amplifiers 61, (SA1, SA2, SA3, ... SAn), a plurality of bit lines BL and /BL, and a plurality of word lines WL.

The upper register set includes a plurality of upper registers 62 (RG1-1, RG2-1, RG3-1, ... RG1-n) for latching data therein, and a plurality of upper transfer switches 63, which connect bit lines/BL and BL of sense amplifiers 61 in DRAM 1 to upper registers 62, respectively, with the upper transfer switches 63 being connected to receive upper transfer signal XF-1.

The lower register set includes a plurality of lower registers 64 (RG1-2, RG2-2, RG3-2, . . . RGn-2), for latching data therein and a plurality of lower transfer switches 65, which connect bit lines /BL and BL of sense amplifiers 61 in DRAM 1 to lower registers 64, respectively, with lower transfer switches 65 being connected to receive lower transfer signal XF-2.

Upper transfer switches 63 of the upper register set include MOS transistors, with sources of the MOS transistors connected to bit lines BL and /BL of sense amplifiers 61 in DRAM 1, with gates of the MOS transistors connected to receive upper transfer signal XF-1, and with drains of the MOS transistors connected to data lines RBL and/RBL of the upper registers, respectively.

Lower transfer switches 65 of the lower register set include MOS transistors, with sources of the MOS transistors connected to bit lines BL and /BL of sense amplifiers 61 in DRAM 1, with gates of the MOS transistors connected to receive lower transfer signal XF-2, and with drains of the MOS transistors connected to data lines RBL and /RBL of lower register 64, respectively.

Bit lines RBL-1 and/RBL-1 of upper registers 62 and bit lines RBL-2 and/RBL-2 of lower registers 64 are connected to data bus I/O through upper switching transistors 66 and lower switching transistors 67, respectively.

Selector part 3' has upper switching transistors 66 and lower switching transistors 67, with each gate of switching transistors 66 and 67 connected to respective switching signals S1-1, S1-2, S2-1, S2-2, . . . Sn-1, Sn-2, which may turn on the switching transistors sequentially. The switching transistors connect output data lines RBL and /RBL of register group 40 to data bus I/O. Upper transfer switches 66 are connected with first select signals S1-1, S2-1, . . . Sn-1, which connect output data lines RBL-1 and /RBL-1 of the upper register set to data bus I/O. Lower transfer switches 67 are connected with second select signals S1-2, S2-2, . . . Sn-2, which connect output data lines RBL-2 and /RBL-2 of the lower register set to data bus I/O.

Each register has a function of latching, with upper registers 62 connected to receive enable signal SRG-1, and lower registers 64 connected to receive enable signal SRG-2. Inputs of the registers are connected to drains of the upper and lower transfer switches, respectively, and outputs of the registers are connected to selector 3' through data lines RBL and /RBL.

The data lines of data bus I/O are connected to sources of the upper switching transistors, which are NMOS transistors of selector 3'. Gates of the upper switching transistors are connected to respective select signals S1-1, . . . Sn-1, with the drains thereof connected to data lines RBL-1 and /RBL-1, which are outputs from the upper register set.

In addition, the data lines of data bus I/O are connected to sources of the lower switching transistors, which also are NMOS transistors of selector 3'. Gates of the lower switching transistors are connected to respective select signals S1-2, . . . Sn-2, with the drains thereof connected to data lines RBL-2 and /RBL-2, which are outputs from the lower register set.

In a read processing mode with the circuit of FIG. 6, a WL is selected by a row address of DRAM 1, and data of cells of DRAM 1 connected to the selected word line are amplified by sense amplifiers 61. As a result, bit lines BL and/BL are established as a "0" or "1" After enable signal SRG-1 of upper registers 62 first goes to a hi-Z state, upper transfer signal XF-1 becomes a "1". The signals of bit lines BL and /BL are transferred to data lines RBL-1 and /RBL-1, and are thereby latched in response to signal SRG-1. Afterwards, DRAM 1 and the upper register set are decoupled from each other by signal XF-1 becoming "0". Next, data of the desired registers can be output by appropriately selecting desired signals S1-1, Sn-1.

Operation of the lower register set may be the same as the upper register set.

With such operation, data of DRAM 1 may be latched to registers in the lower register set during the time when data of the upper register set are being transferred to data bus I/O. After the data of the upper register set have been transmitted to data bus I/O, latched data of the lower register set may be transmitted immediately to data bus I/O so that rapid read processing may be accomplished.

In write mode processing through data bus I/O, signals S1–Sn are enabled synchronously according to the system clock by using column addresses of DRAM 1, and serial data from data bus I/O are written in each register of the upper register set. At the same time, enable signal SRG-1 of the upper register set is "1", and transfer signal XF-1 of the upper register set is "0" When all data are written to upper registers 62 of the upper register set, signal XF-1 goes to a "1" so that data of upper registers 62 are written to DRAM 1 in accordance with the selected word line. In this case, signal XF holds a "1" in order to write the data to cells of DRAM 1 until all bit lines BL and /BL change its state to that of RBL-1 and /RBL-1 in the upper register set.

During a period when data of the upper register set are written to DRAM 1, registers of the lower register set may input new data, consecutively. As a result, in write mode, writing data to DRAM 1 can be accomplished rapidly with less time delay.

A method of the present invention for writing data from data bus I/O to DRAM 1 and reading data from DRAM 1 to data bus I/O using a digital video memory circuit, which includes a DRAM for storing and reading data therefrom, a register group for holding data to be written to and read from the DRAM, a selector having switching transistors connecting registers in the register group to data bus I/O, respectively, for storing data on data bus I/O to the DRAM and for transferring data from the DRAM to data bus I/O, wherein the register group includes an upper register set and a lower register set, which are connected parallely between the DRAM and the selector, and the method may include the steps of (1) writing data latched in the upper register set to the DRAM, while at the same time sequentially receiving data from data bus I/O, and latching the received data in the lower register set, (2) writing data latched in the lower register set to the DRAM while at the same time sequentially receiving data from data bus I/O, and latching the received data in the upper register set, and (3) repeating steps (1) and (2).

According to the present invention, a reading operation may be carried out immediately with less time delay as compared with using only one register set in read mode. Further, while one register set performs transferring data latched in the registers to data bus I/O, the other register set can receive new data from the DRAM.

In a write mode of the present invention, while one register set is writing data to the DRAM by applying signals until bit lines BL and /BL of the DRAM are set to a corresponding data state of the data lines from the registers, the other register set may receive new data consecutively from data bus I/O.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A digital memory comprising a DRAM for storing and reading data, a register group for holding data to be written to and read from the DRAM, a selector for connecting registers of the register group to a data bus, wherein:

the register group comprises a first register set having a plurality of first registers and a second register set having a plurality of second registers, wherein the first and second register sets are connected serially between the DRAM and the selector, wherein the second register set transfers data on the data bus to the first register set, and the first register set transfers data from the second register set to the DRAM; and wherein the second register set receives data from the data bus while the first register set writes data to the DRAM.

2. The memory of claim 1, wherein:

the DRAM comprises a plurality of sense amplifiers, a plurality of bit lines, and a plurality of word lines;

the first register set comprises a plurality of first transfer switches connecting the bit lines of the DRAM to respective first registers, wherein the first transfer switches are controlled by a first transfer signal; and the second register set comprises a plurality of second transfer switches connecting the respective first registers to respective second registers, wherein the second transfer switches are controlled by a second transfer signal.

3. The memory of claim 2, wherein:

the first transfer switches comprise first MOS transistors, wherein sources of the first MOS transistors are connected to the bit lines of the DRAM, wherein gates of the first MOS transistors receive the first transfer signal, and wherein drains of the first MOS transistors are connected to the respective first registers; and the second transfer switches comprise second MOS transistors, wherein sources of the second MOS transistors are connected to the respective first registers, wherein gates of the second MOS transistors receive the second transfer signal, and wherein drains of the second MOS transistors are connected to the respective second registers.

4. A memory circuit comprising a DRAM for storing data thereto and reading data therefrom via a plurality of bit line pairs, a register group for holding data to be written to and read from the DRAM, a selector comprising switching transistors connecting registers in the register group to a data bus, wherein:

the register group comprises an upper register set and a lower register set, wherein the upper and lower register sets are parallely connected between the DRAM and the selector and have a plurality of upper registers and a plurality of lower registers, respectively, corresponding to each of the bit line pairs; and wherein the upper register set transfers data to the DRAM while the lower register set receives data from the data bus, and the upper register set transfers data to the data bus while the lower register set receives data from the DRAM.

5. The circuit of claim 4, wherein:

the DRAM comprises a plurality of sense amplifiers, the plurality of bit line pairs, and a plurality of word lines;

the upper register set comprises a plurality of upper transfer switches, wherein the upper transfer switches connect corresponding bit line pairs of the DRAM to respective, corresponding upper registers, wherein the upper transfer switches are controlled by an upper transfer signal; and the lower register set comprises a plurality of lower transfer switches, wherein the lower transfer switches connect corresponding bit line pairs of the DRAM to respective, corresponding lower registers, wherein the lower transfer switches are controlled by a lower transfer signal.

6. The circuit of claim 5, wherein:

the upper transfer switches comprise upper MOS transistors, wherein sources of the upper MOS transistors are connected to corresponding bit line pairs of the DRAM, wherein gates of the upper MOS transistors receive the upper transfer signal, and wherein drains of the upper MOS transistors are connected to respective, corresponding upper registers;

the lower transfer switches comprise lower MOS transistors, wherein sources of the lower MOS transistors are connected to corresponding bit line pairs of the DRAM, wherein gates of the lower MOS transistors receive the lower transfer signal, and wherein drains of the lower MOS transistors are connected to respective, corresponding lower registers; and the selector comprises upper switching transistors and lower switching transistors, wherein the gates of the upper and lower switching transistors receive respective switching signals, wherein the upper registers and the lower registers are connected to the data bus through the upper switching transistors and the lower switching transistors, respectively.

7. A method for writing data from a data bus to a DRAM and reading data from the DRAM to the data bus with a digital video memory circuit, the circuit having the DRAM, a register group for holding data to be written to and read from the DRAM, a selector having switching transistors connecting registers in the register group to the data bus, wherein the register group has first and second register sets connected serially between the DRAM and the selector and having a plurality of first and second registers respectively, the second register set transferring data on the data bus to the first register set, and the first register set transferring data from the second register set to the DRAM, the method comprising the steps of:

(a) writing data latched in the first register set to the DRAM while receiving data from the data bus in the second register set;

(b) transferring data latched in the second register set to the first register set;

(c) repeating steps (a) and (b).

8. A method for writing data from a data bus to a DRAM having a plurality of bit line pairs and reading data from the DRAM to the data bus with a digital video memory circuit, the circuit having the DRAM, a register group for holding data to be written to and read from the DRAM, a selector having switching transistors connecting registers in the register group to the data bus, the circuit storing data on the data bus to the DRAM and transferring data from the DRAM to the data bus, wherein the register group has an upper register set and a lower register set parallely connected between the DRAM and the selector and having a plurality of upper registers and a plurality of lower registers, respectively, corresponding to each of the bit line pairs, the method comprising the steps of:

(a) writing data latched in corresponding registers of the upper register set to the DRAM via corresponding bit line pairs while receiving data from the data bus in the lower register set;

(b) writing data latched in corresponding lower registers of the lower register set to the DRAM via corresponding bit line pairs while receiving data from the data bus in the upper register set;

(c) repeating steps (a) and (b).

* * * * *